United States Patent
Bauer et al.

(10) Patent No.: US 9,915,688 B2
(45) Date of Patent: Mar. 13, 2018

(54) AIRBORNE DATA COLLECTION

(71) Applicant: DataFlyte, Inc., Knoxville, TN (US)

(72) Inventors: Martin L. Bauer, Oak Ridge, TN (US); Daniel L. Nower, Knoxville, TN (US); John M. Dischner, Powell, TN (US); Daniel J. Morse, Agoura Hills, CA (US); Matthew S Williamson, Knoxville, TN (US); W Scott McDonald, Soddy Daisy, TN (US)

(73) Assignee: Dataflyte, Inc., Knoxville, TN (US)

( * ) Notice: Subject to any disclaimer, the term of this patent is extended or adjusted under 35 U.S.C. 154(b) by 559 days.

(21) Appl. No.: 14/564,534

(22) Filed: Dec. 9, 2014

(65) Prior Publication Data
US 2015/0163849 A1    Jun. 11, 2015

Related U.S. Application Data

(60) Provisional application No. 61/913,685, filed on Dec. 9, 2013, provisional application No. 61/925,137, filed on Jan. 8, 2014.

(51) Int. Cl.
*G01R 21/00* (2006.01)
*G01D 4/00* (2006.01)
(Continued)

(52) U.S. Cl.
CPC ............. *G01R 21/00* (2013.01); *G01D 4/006* (2013.01); *G01R 22/063* (2013.01); *H04W 4/005* (2013.01);
(Continued)

(58) Field of Classification Search
CPC ....... H04W 84/18; H04W 84/22; G01R 21/00
(Continued)

(56) References Cited

U.S. PATENT DOCUMENTS 3,430,243 A * 2/1969 Evans .................... G01S 11/06
                                                                       250/342
3,688,271 A     8/1972 Rouse
(Continued)

FOREIGN PATENT DOCUMENTS

| WO | 2012092509 | 7/2012 | |
| WO | 2012127210 | 9/2012 | |
| WO | WO 2013/122424 | * 8/2013 | ............ H04W 74/06 |

OTHER PUBLICATIONS

Arnold, "Development and Improvement of Airborne Remote Sensing Radar Platforms", PhD dissertation at University of Kansas (2013).*

*Primary Examiner* — Jay C Kim
(74) *Attorney, Agent, or Firm* — Luedeka Neely Group, P.C.; Rick Barnes

(57) ABSTRACT

A meter reading system for communicating with Automated Meter Reading meters. The system includes an airborne platform and a meter data collection system disposed on the airborne platform. The meter data collection system includes antennas, with each of the antennas pointing in a different direction, one from another, and each antenna generally pointing downward when the airborne platform is airborne. The antennas receive meter data from the meters. The meter data collection system also includes transceivers, one each of the transceivers associated with and in signal communication with one each of the antennas. The transceivers receive the meter data through the antennas. A first computer is in signal communication with the transceivers, and receives the meter data from the transceivers.

6 Claims, 2 Drawing Sheets

(51) Int. Cl.
*H04W 4/00* (2018.01)
*G01R 22/06* (2006.01)

(52) U.S. Cl.
CPC ........... *Y02B 90/243* (2013.01); *Y02B 90/246* (2013.01); *Y04S 20/325* (2013.01); *Y04S 20/42* (2013.01)

(58) Field of Classification Search
USPC ......................................................... 702/62
See application file for complete search history.

(56) References Cited

U.S. PATENT DOCUMENTS

| | | | |
|---|---|---|---|
| 3,705,385 A | 12/1972 | Batz | |
| 3,900,842 A | 8/1975 | Calabro et al. | |
| 3,935,574 A * | 1/1976 | Pentheroudakis | G01S 3/48 342/424 |
| 3,972,044 A * | 7/1976 | Alford | G01S 1/40 342/406 |
| 4,119,948 A | 10/1978 | Ward et al. | |
| 4,213,119 A | 7/1980 | Ward et al. | |
| 4,305,077 A * | 12/1981 | Tsumura | G01S 1/54 342/451 |
| 4,313,117 A * | 1/1982 | Lipsky | G01S 3/32 342/437 |
| 4,443,786 A | 4/1984 | Hammerling et al. | |
| 4,734,702 A * | 3/1988 | Kaplan | G01S 3/48 342/424 |
| 4,833,478 A * | 5/1989 | Nossen | G01S 3/20 342/432 |
| 4,929,958 A * | 5/1990 | Hodel | G01S 3/28 342/432 |
| 5,039,991 A * | 8/1991 | Boese | G01S 3/043 342/169 |
| 5,231,413 A * | 7/1993 | Dubois | G01S 13/78 343/833 |
| 5,396,255 A * | 3/1995 | Durkota | H01Q 3/267 342/173 |
| 5,625,868 A | 4/1997 | Jan et al. | |
| 5,642,122 A * | 6/1997 | Lockie | B64G 1/22 343/881 |
| 5,684,843 A | 11/1997 | Furukawa et al. | |
| 5,696,501 A | 12/1997 | Ouellette et al. | |
| 5,748,104 A | 5/1998 | Argyroudis et al. | |
| 5,764,158 A | 6/1998 | Franklin et al. | |
| 5,801,643 A | 9/1998 | Williams et al. | |
| 5,870,056 A * | 2/1999 | Fowler | G01S 11/10 342/156 |
| 5,892,758 A | 4/1999 | Argyroudis | |
| 5,894,422 A | 4/1999 | Chasek | |
| 5,910,799 A | 6/1999 | Carpenter et al. | |
| 6,006,212 A | 12/1999 | Schleich et al. | |
| 6,069,571 A | 5/2000 | Tell | |
| 6,078,785 A | 6/2000 | Bush | |
| 6,088,659 A | 7/2000 | Kelley et al. | |
| 6,177,883 B1 | 1/2001 | Jennetti et al. | |
| 6,195,018 B1 | 2/2001 | Ragle et al. | |
| 6,329,947 B2 * | 12/2001 | Smith | G01S 3/023 342/417 |
| 6,618,016 B1 * | 9/2003 | Hannan | H01Q 1/28 343/705 |
| 6,664,938 B2 * | 12/2003 | Strickland | H01Q 21/067 343/853 |
| 6,806,837 B1 * | 10/2004 | Saucier | H01Q 3/267 342/169 |
| 6,933,857 B2 | 8/2005 | Foote | |
| 7,042,394 B2 * | 5/2006 | Sayers | G01S 3/18 342/432 |
| 7,233,285 B2 * | 6/2007 | Struckman | G01S 5/12 342/451 |
| 7,257,424 B2 * | 8/2007 | Hamalainen | H04B 7/10 455/101 |
| 7,268,728 B1 * | 9/2007 | Struckman | G01S 5/04 342/424 |
| 7,385,524 B1 | 6/2008 | Orlosky | |
| 8,068,065 B1 * | 11/2011 | Struckman | H01Q 11/10 343/769 |
| 8,260,143 B2 * | 9/2012 | Gupta | H04L 27/2096 398/115 |
| 8,373,596 B1 * | 2/2013 | Kimball | G01S 5/04 342/444 |
| 8,818,397 B2 * | 8/2014 | Shikowitz | G01D 21/00 370/252 |
| 8,989,091 B2 * | 3/2015 | Muhanna | H04W 4/005 370/328 |
| 9,488,715 B2 * | 11/2016 | Huard | G01S 3/14 |
| 9,585,095 B2 * | 2/2017 | Merlin | H04W 52/0216 |
| 2001/0038342 A1 | 11/2001 | Foote | |
| 2003/0210195 A1 | 11/2003 | Hager et al. | |
| 2005/0250503 A1 * | 11/2005 | Cutrer | H04L 1/0606 455/447 |
| 2007/0093944 A1 | 4/2007 | Lee | |
| 2008/0074285 A1 | 3/2008 | Guthrie | |
| 2012/0173032 A1 | 7/2012 | Pamulaparthy et al. | |
| 2013/0042014 A1 | 2/2013 | Hughes et al. | |
| 2015/0009879 A1 * | 1/2015 | Kim | H04W 74/06 370/311 |
| 2015/0036572 A1 * | 2/2015 | Seok | H04W 52/0216 370/311 |

\* cited by examiner

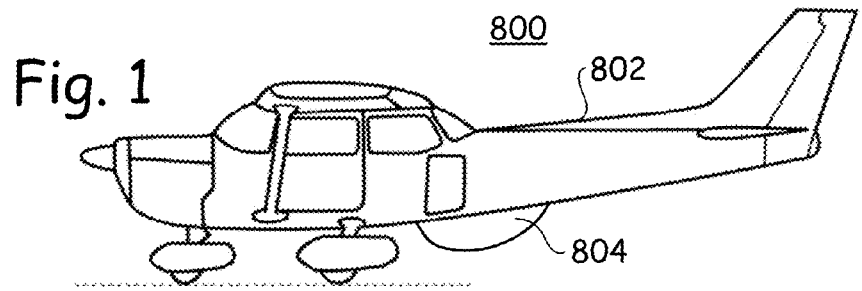
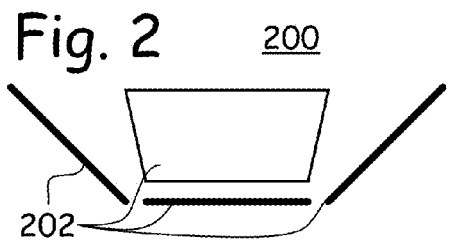
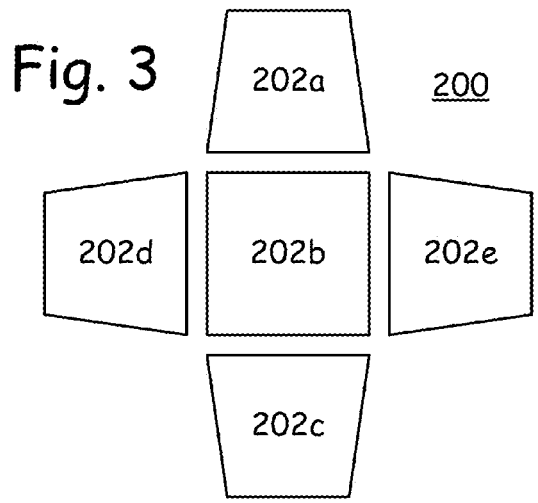
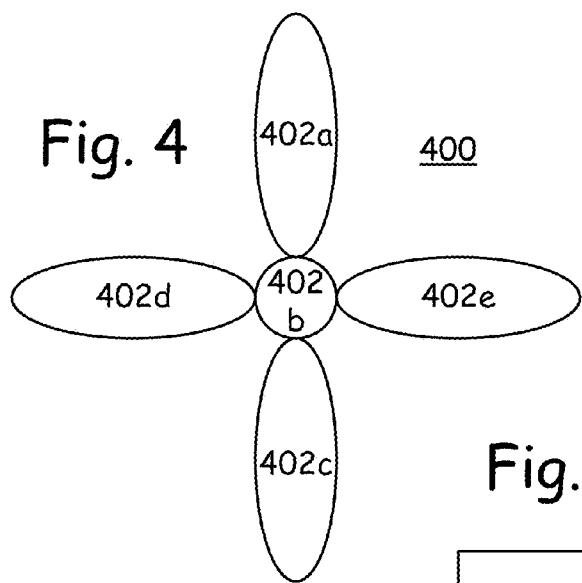
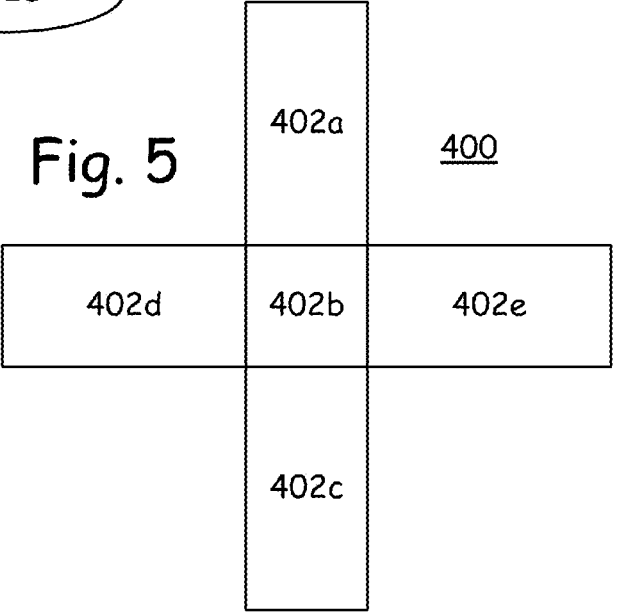

AIRBORNE DATA COLLECTION

This applications claims rights and priority on prior U.S. provisional patent application Ser. Nos. 61/913,685 filed Dec. 9, 2013 and 61/925,137 filed Jan. 8, 2014, the entire disclosures of which are incorporated herein by reference. This invention relates to the field of reading utility meters. More particularly, this invention relates to reading utility meters from an airborne platform.

FIELD

Introduction

Utility meters are typically read by crews of meters readers who each have a route that they are responsible for. The meter reader walks up to each individual meter, identifies the meter on a list of meters, visually reads the dials on the meter, enters the value into a meter log, and then proceeds to the next meter on the route. At the end of the day, the collected data is transcribed into a database. This same routine must be performed for each meter in service by the utility company on a regular basis, when service is started or stopped, or when utility theft or leakage is suspected.

Obviously, this system of reading meters is both labor and time intensive, and therefore costly. Because of the effort and time required, many meters do not get read as frequently as would be desired by the utility company. In such cases, the usage is sometimes estimated, and imprecise charges are billed out to the utility customers.

Adding to the workload, government regulations are requiring increasing accountability for the distribution of certain metered commodities, such as water and natural gas, to minimize the loss of these commodities, such as by leakage.

Some utility companies have installed Automated Meter Reading (AMR) systems. AMR meters are fitted with a meter transceiver that communicates with a second transceiver that the meter reader carries with him as he performs his rounds. However, for a variety of reasons, the meter reader often has to spend some amount of time trying to find a position at which the two transceivers can reliably communicate.

Putting a transceiver on a mobile platform, such as a truck or an airplane, allows some of the meters to be read more quickly, but tends to completely miss a large number of the meters on a given route, because the mobile platform is not properly positioned to read those meters.

What is needed, therefore, is a system of meter reading that tends to reduce problems such as those described above, at least in part.

SUMMARY OF THE CLAIMS

The above and other needs are met by a meter reading system for communicating with Automated Meter Reading meters. The system includes an airborne platform and a meter data collection system disposed on the airborne platform. The meter data collection system includes antennas, with each of the antennas pointing in a different direction, one from another, and each antenna generally pointing downward when the airborne platform is airborne. The antennas receive meter data from the meters. The meter data collection system also includes transceivers, one each of the transceivers associated with and in signal communication with one each of the antennas. The transceivers receive the meter data through the antennas. A first computer is in signal communication with the transceivers, and receives the meter data from the transceivers.

In some embodiments according to this aspect of the invention, the antennas produce footprints with no significant gap between them and with no significant overlap between them.

Some embodiments include a first antenna facing forward at about a forty-five degree angle from vertically downward along an intended direction of travel of the airborne platform, a second antenna facing rear at about a forty-five degree angle from vertically downward along the intended direction of travel, a third antenna facing right at about a forty-five degree angle from vertically downward along the intended direction of travel, a fourth antenna facing left at about a forty-five degree angle from vertically downward along the intended direction of travel, and a fifth antenna facing substantially vertically downward relative to the airborne platform.

In some embodiments, the first computer generates a wake-up command and sends the wake-up command through the transceivers and the antennas to the meters.

In some embodiments, the meter data includes at least one of a meter reading, a meter identification, a meter type, a date stamp, a time stamp, a date when last read, a time when last read, handshake protocols, and a status indication.

In some embodiments, the first computer includes a memory for storing meter location data and meter identification data for a set of meters to be read, and a processor for matching received meter data with the stored meter location data and the stored meter identification data, and for tracking which of the set of meters have been read by the system and which of the meters have not been read by the system.

In some embodiments, a status display presents a visual display of a terrain above which the airborne platform is traveling, with indications on the display of a set of meters to be read, where the indications for those meters that have been read are presented with a first formatting and the indications for those meters that have not been read are presented with a second formatting that is different from the first formatting. In some embodiments, the airborne platform is one of an airplane, glider, projectile, helicopter, drone, balloon, dirigible, and satellite.

According to another aspect of the invention there is described a method for reading Automated Meter Reading meters within a geographical area, by flying an airborne platform over the geographical area and receiving meter data from the meters with a plurality of antennas disposed on the airborne platform.

In some embodiments according to this aspect of the invention, a visual display of a terrain above which the airborne platform is traveling is presented, with indications on the display of a set of meters to be read, where the indications for those meters that have been read are presented with a first formatting and the indications for those meters that have not been read are presented with a second formatting that is different from the first formatting.

In some embodiments, flying the airborne platform includes flying the airborne platform at an altitude of up to about five thousand feet above the geographical area. In some embodiments, the step of flying the airborne platform includes flying the airborne platform at a speed of up to about two hundred miles per hour. In some embodiments, the step of flying the airborne platform includes flying the airborne platform in a grid pattern covering the geographical area until all of the meters have been read.

In some embodiments, information in regard to a set of meters to be read is received into a first computer on the airborne platform from a second ground-based computer before flying the airborne platform, and the information and meter data that has been read is sent from the first computer to the second computer after landing the airborne platform.

In some embodiments, the meter data includes at least one of a meter reading, a meter identification, a meter type, a date stamp, a time stamp, a date when last read, a time when last read, handshake protocols, and a status indication. In some embodiments, the antennas produce beam footprints with no significant gap between them and with no significant overlap between them.

According to yet another aspect of the invention, there is described a meter reading system for communicating with Automated Meter Reading meters, where the system includes an airborne platform and a meter data collection system disposed on the airborne platform. The meter data collection system includes an articulable antenna generally pointing downward when the airborne platform is airborne, where the antenna is movable while the airborne platform is airborne. The antenna is for receiving meter data from the meters. The meter data collection system also includes transceivers, with one each of the transceivers associated with and in signal communication with one each of the antennas. The transceivers receive the meter data through the antennas. A first computer is in signal communication with the transceivers, and receives the meter data from the transceivers.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 depicts an airborne platform with a meter data collection system according to an embodiment of the present invention.

FIG. 2 depicts a side view of an antenna arrangement according to an embodiment of the present invention.

FIG. 3 depicts a bottom view of an antenna arrangement according to an embodiment of the present invention.

FIG. 4 depicts a combined beam footprint according to a first embodiment of the present invention.

FIG. 5 depicts a combined beam footprint according to a second embodiment of the present invention.

DETAILED DESCRIPTION

With reference now to FIG. 1, there is depicted a basic embodiment 800 of a meter data collection system 804 and an airborne platform 802. The platform 802 is a platform that is not continuously physically terrestrially tethered or depending, such as an airplane, glider, projectile, helicopter, drone, balloon, dirigible, satellite, or other such. The platform 802 in some embodiments is piloted from within the platform 802, and in other embodiments is remotely piloted. Piloting of the platform 802 is by human operator in some embodiments, and computer controlled in other embodiments. In some embodiments the airborne platform 802 collects meter data at an altitude of up to about five thousand feet. In one embodiment, the altitude is about one thousand feet, and provides ground coverage of about three thousand feet. During meter data collection, the platform 802 travels at a speed of up to about two hundred miles per hour, in some embodiments.

Figure 7:
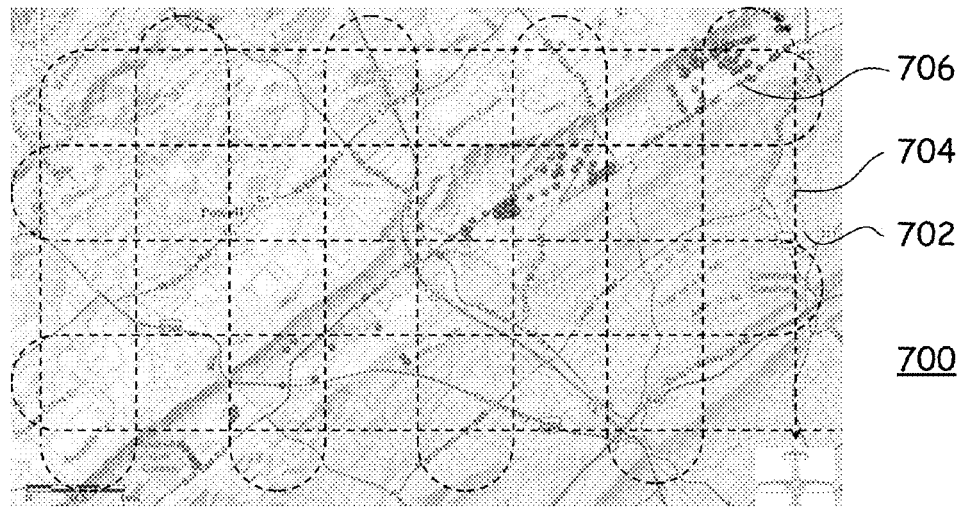
FIG. 7 depicts a map of meters and a collection route according to an embodiment of the present invention.

In operation, and with reference to FIG. 7, the platform 802 travels along a route 704 above a geographical area 702 serviced by a utility company, and in which are disposed a set of meters 706 that the utility company desires to have read. The meters 706 can be for any one or more of a variety of different services, such as natural gas, electricity, water, waste, and so forth. The meters 706 are of a type that include, for example, one or more of an electrical power generator or supply, sensors for taking a meter reading, a memory for storing the reading, a radio frequency transceiver and antenna for receiving commands and sending data, a clock, and a processor for controlling the operation of the meter 706.

As the platform 802 travels along the route 704, the system 804 receives RF signals from the meters 706. In some embodiments, the system 804 sends signals to the meters 706, as described elsewhere herein. The signals sent from the meters 706 indicate the reading of each meter 706. The meters 706, in some embodiments, spontaneously transmit a signal containing the meter 706 reading, such as at regular timed intervals. For example, in one embodiment, some of the meters 706 send reading signals every fifteen seconds. In other embodiments, the meters 706 don't send a reading signal unless they receive a wake-up signal prompting them to do. The system 804 is, in some embodiments, capable of working with meters 706 of either variety. The reading signal from the meter 706 includes at least the meter reading, and in some embodiments optionally includes one or more of a meter identification, a meter type, a date stamp, a time stamp, a date when last read, a time when last read, handshake protocols, and a status indication.

The system 804 includes an arrangement 200 of more than one antenna 202 (as depicted in FIGS. 2 and 3). In some embodiments the antennas 202 are disposed at a variety of angles in relation to each other and to a horizon and terrain 702 that is below the airborne platform 802 during data collection. In some embodiments the arrangement 200 is disposed within a belly pod or some other type of enclosure that is mounted to the platform 802, to shield the arrangement 200 from wind, weather, and other hazards. In other embodiments, the arrangement 200 is disposed within the platform 802. In one embodiment, flat panel or patch antennas 202 similar to ARC Solutions Model ARC-PA0913B01 are used. The high gain (12 dBi) and polarization allow the arrangement 200 of antennas 202 to be mounted in an optimized orientation from a higher altitude allowing for maximum ground coverage.

In some embodiments, the antenna arrangement 200 is configured to send and receive signals in a combined beam footprint 400 (as depicted in FIGS. 4 and 5), where each footprint 402 from a given one of the antennas 202 is directed along a different axis. In some embodiments, edges of the footprints 402 do not overlap to any significant degree. This can be accomplished, for example, by adjusting the angles in which the antennas 202 are directed, according to the altitude at which the platform 802 is flying, and according to the beam shape of the type of antennas 202 that are used.

In some embodiments, the footprints 402 are spaced so as to be relatively narrowly packed together, without any significant amount of dead space between the footprints 402.

In some embodiments, all of the antennas 202 direct their beam footprints 402 in a generally downward-facing direction, which is toward the earth when the platform 802 is above the earth in an airborne attitude. In some embodiments, only one of the antennas 202 is directed so as to direct its footprint 402 along an axis that is substantially perpendicular to the general plane of the earth.

In some embodiments the arrangement 200 includes five antennas 202. In some embodiments, four of the antennas 202 are disposed so as to direct their footprints 402 along axes that are designated as forward, backward, left, and right, relative to the anticipated direction of travel of the platform 802. In some embodiments the positions of the antennas 202 in the arrangement 200 are fixed, and in other embodiments the positions of the antennas 202 in the arrangement 200 are adjustable, such as by being remotely adjustable from a remote control console.

FIGS. 2 and 3 depict a downward facing antenna 202b in the center of the arrangement 200, with angled antennas 202a and 202c-e disposed orthogonally around the downward facing antenna 202b. However, it is appreciated that this is only one embodiment of the arrangement 200 configuration, and that other embodiments of the configuration of the arrangement 200 are also contemplated. For example, the antennas 202 could be in two rows, one row with two antennas 202 and the second row with three antennas 202. Alternately, all of the antennas 202 could be in a single column of antennas 202, each adjusted to send and receive signals along different axes. Further, as mentioned elsewhere herein, although the figures depict five antennas 202, embodiments with either a greater or lesser number of antennas 202 (but always more than one antenna 202) are contemplated herein.

FIGS. 4 and 5 depict two embodiments of the combined beam footprint 400 of the antenna arrangement 200. The exact shape of footprint 402 produced by each antenna 200 is different in different embodiments, as are the number of footprints 402 (as dependent upon the number of antennas 202). However, in some embodiments the footprints 402 are configured such that there are no significant gaps between the proximate edges of the footprints 402, but also so that the footprints 402 do not overlap to any significant degree. In some embodiments, the footprints 402a and c-e are directed outward at an angle (such as at 45 degrees from normal), and thus are elongated in the direction of the angle of disposition, as compared to the downward facing footprint 402b from antenna 202b, which is disposed at an angle that is substantially normal to terrain above which the platform 802 is flying. Combined beam footprints 400 other than the orthogonal embodiments depicted are also contemplated.

Some embodiments use a single antenna 202, however, in a single antenna embodiment, the antenna 202 is movable during flight of the airborne platform 802. The movement of the single antenna 202 has various embodiments. For example, in one embodiment the single antenna 202 is programmed to have a regular sweep pattern, such as is programmable either in advance or in real time. In other embodiments, the single antenna 202 is movable by an operator using a control during flight, where in some embodiments the operator is on the airborne platform 802, and in other embodiments the operator is remotely located. In other embodiments at least one of the angle and direction of the single antenna 202 is adjusted by a computer, either on the airborne platform 802 or remotely located. In one such embodiment, the computer determines whether known meters 706 over the terrain 702 have been read, and if not, adjusts the position of the antenna 802 in a manner that is calculated to better read the unread meters 706.

Figure 6:
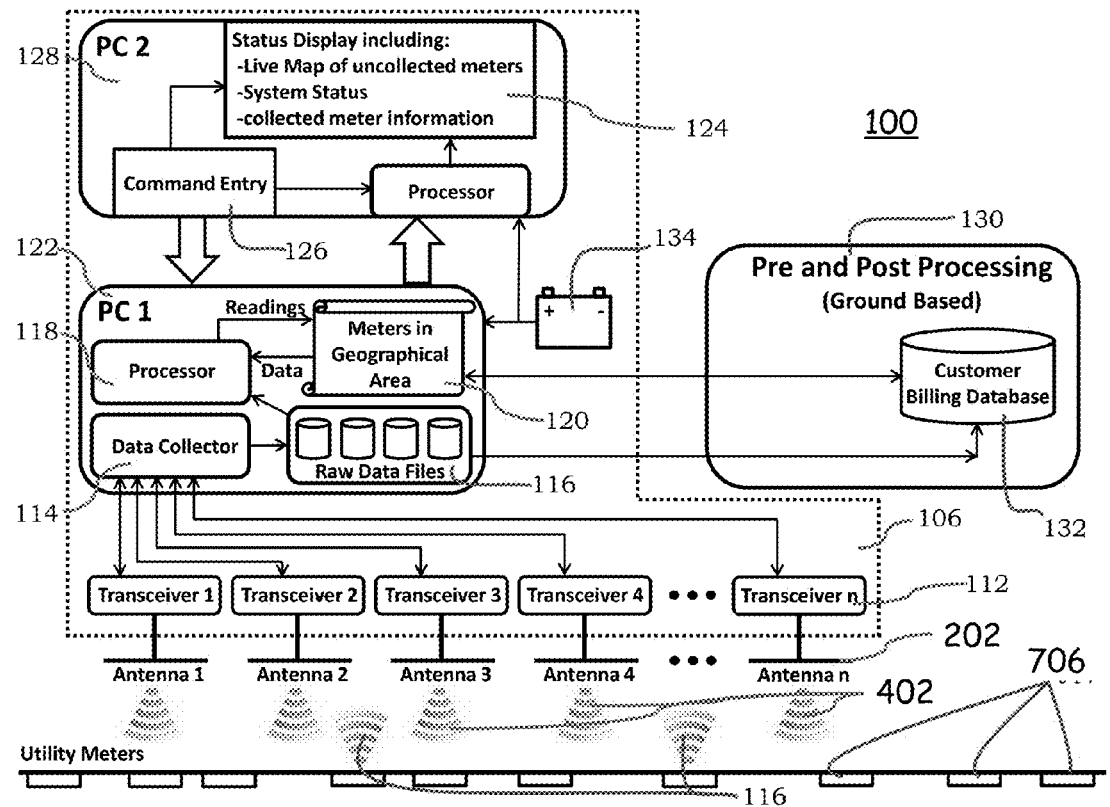
FIG. 6 depicts a functional block diagram of a system according to an embodiment of the present invention.

With reference now to FIG. 6, there is depicted a functional block diagram 100 of the system 800, according to an embodiment of the invention. As previously discussed, the system 100 send commands to and receives information from the meters 706. The meters 706 send out RF signals 116 that are received by the antennas 202, and the antennas 202 send out RF signals 402 that are received by the meters 706. In many applications, the meters 706 are disposed below ground level in enclosures that have thick metal covers. The covers tend to dramatically impede the broadcast or reception of RF signals through them, and thus the signals that are predominantly sent and received between the antennas 202 and such meters 706 pass through the soil or other material around the circumference of the chamber in which the given meter 706 is disposed.

A given meter 706 may or may not require a wake-up signal from the system 100. Thus, the system 100 is configured to regularly send out such wake-up signals according to some predetermined schedule, such as every few seconds. Further, because the system 100 is designed to communicate with meters 706 from a variety of different manufacturers, the system 100 is configured to send and receive signals utilizing a variety of different protocols, according to the various requirements of the different manufacturers.

Meters 706 that are awake—whether they required a signal to wake up or not—broadcast an RF signal that contains the information as described elsewhere herein, including the meter reading. The signal is received by at least one of the antennas 202, and passed along to a transceiver 112, where in some embodiments, one transceiver 112 is dedicated to each antenna panel 202. The transceivers 112 convey the received data to a data collector unit 114 that is disposed within a first computer 122. The data collector 114, in some embodiment, performs some type of basic data analysis to determine the format and information contained within the data signal from a given meter 706, and then writes the data to a memory 116. Stored in a second memory 120, or in just a different portion of the same memory 116, is information in regard to the meters 706 that are to be read by the system 100. This information is, in one embodiment, received from a main computer system 130, such as a computer at the utility company. The information is a subset of the customer database 132, and in one embodiment comprises the information about the location and type of meters to be read on a given run of the system 800. The information sent between the utility company computer 130 and the first computer 122 can be transferred either in real time during flight and acquisition, or in a batch mode before and after the flight.

The first computer 122 is under the control of a processor 118, that compares the data in regard to the meters 706 that are to be read (120) to the data that has been read (116), so as to determine whether all of the meters 706 have been read. The processor 118 can also perform additional analysis on the data 116, or all such post processing of the data can be left to the ground based computer 130.

Some embodiments include a second computer 128, through which commands 126 are provided to the first computer 122, and through which information in regard to the meters 706 is displayed. In one embodiment the second computer 128 includes a display 124 that presents a display 700, such as of the terrain 702 and the meters 706. In some embodiments the second computer 122 interfaces with flight avionics to produce and control a flight path 704, such as designed to enable substantially complete coverage of the desired area and receipt of all of the desired data. The first and second computers 122 and 128 are powered, in some embodiments, such as by a battery power source 134.

In some embodiments the display 700 depicts meters 706 with uncollected data according to a first format, and meters 706 with collected data according to a second format, such as depicting uncollected meters 706 with red dots and collected meters 706 with green dots, or completely removing the dot for a given meter 706 after the data for the given meter 706 has been successfully read. Other formats can be used for meters 706 with a status other than collected an uncollected, such as a format for meters 706 that are reporting unreliably, have an error status, or report incomplete or inaccurate data.

The selection criteria for the meters 706 to be read includes, in some embodiments, all meters 706, meters 706 on the current billing cycle, meters 706 for utilities to be turned off, and meters 706 where leakage or theft is expected. The information 120 in some embodiments includes meter 706 identification numbers and geo-location coordinates. Once the processor 118 determines the status of a given meter 706, it passes that processed data to the second computer 128 to update the display 124.

The route 704 for a specific geographic region can be in a grid pattern, or in some other pattern that is optimized to the geometric layout of the specific geographic area and the locations of the meters 706 to be collected.

Once the meter data is collected, the platform 802 can return to a ground position where, in some embodiments, the data is downloaded to the computer 130 and post-processed. The raw data 116 acquired is used in such embodiments to update the complete customer database 132 to include the new status and usage information. The updated customer database 132 can be used for a variety of purposes, such as customer invoicing. In other embodiments all processing of the data is accomplished by one of the computers 122 and 128. In some embodiments the data is sent in real time from the first computer 122 to the ground based computer 130, where it is processed.

In one embodiment, the antennas operate such that the signal from a first of the antennas is received by the meter transceiver and causes it to retrieve and transmit a reading from the meter, and a second of the antennas receives the signal transmitted by the meter.

In another embodiment, a first antenna 202 directs its beam in a direction that is in the direction of travel of the airborne platform 802, causes the meter 706 to retrieve and transmit a reading, and a second of the antennas 202 directs its beam in a direction that is not in the direction of travel of the airborne platform 802 and receives the reading from the meter 706.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A meter reading system for communicating with automated meter reading meters, the system comprising:
   an airborne platform,
   a meter data collection system disposed on the airborne platform, the meter data collection system including,
      antennas, each of the antennas pointing in a different direction, one from another, each antenna generally pointing downward when the airborne platform is airborne, the antennas for receiving meter data from the meters, wherein the antennas further comprise:
         a first antenna facing forward at about a forty-five degree angle from vertically downward,
         a second antenna facing rear at about a forty-five degree angle from vertically downward,
         a third antenna facing right at about a forty-five degree angle from vertically downward,
         a fourth antenna facing left at about a forty-five degree angle from vertically downward, and
         a fifth antenna facing substantially vertically downward,
      transceivers, each of the transceivers associated with and in signal communication with an individual and unique one of the antennas, the transceivers for receiving the meter data through the antennas, and
      a first computer in signal communication with the transceivers, the first computer for receiving the meter data from the transceivers.

2. The system of claim 1, further comprising the first computer for generating a wake-up command and sending the wake-up command through the transceivers and the antennas to the meters.

3. The system of claim 1, wherein the meter data includes at least one of a meter reading, a meter identification, a meter type, a date stamp, a time stamp, a date when last read, a time when last read, handshake protocols, and a status indication.

4. The system of claim 1, wherein the first computer comprises a memory for storing meter location data and meter identification data for a set of meters to be read, and a processor for matching received meter data with the stored meter location data and the stored meter identification data, and for tracking which of the set of meters have been read by the system and which of the meters have not been read by the system.

5. The system of claim 1, further comprising a status display for presenting a visual display of a terrain above which the airborne platform is traveling, with indications on the display of a set of meters to be read, where the indications for those meters that have been read are presented with a first formatting and the indications for those meters that have not been read are presented with a second formatting that is different from the first formatting.

6. The system of claim 1, wherein the airborne platform comprises one of an airplane, glider, projectile, helicopter, drone, balloon, dirigible, and satellite.

* * * * *